United States Patent
Jung et al.

(10) Patent No.: US 10,141,724 B2
(45) Date of Patent: Nov. 27, 2018

(54) APPARATUS OF SLIDING SUBMODULE

(71) Applicant: LSIS CO., LTD., Anyang-si, Gyeonggi-do (KR)

(72) Inventors: Teag Sun Jung, Anyang-si (KR); Woong Hyeob Song, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 15/869,975

(22) Filed: Jan. 12, 2018

(65) Prior Publication Data

US 2018/0316164 A1    Nov. 1, 2018

(30) Foreign Application Priority Data

Apr. 28, 2017    (KR) .......................... 10-2017-0054823

(51) Int. Cl.
| | |
|---|---|
| H05K 7/20 | (2006.01) |
| H02B 1/56 | (2006.01) |
| H02J 3/10 | (2006.01) |
| H02H 7/22 | (2006.01) |
| A47B 88/487 | (2017.01) |
| H02B 1/30 | (2006.01) |
| H02J 13/00 | (2006.01) |
| H02J 9/04 | (2006.01) |

(52) U.S. Cl.
CPC ........... *H02B 1/565* (2013.01); *A47B 88/487* (2017.01); *H02B 1/30* (2013.01); *H02H 7/22* (2013.01); *H02J 3/10* (2013.01); *H02J 9/04* (2013.01); *H02J 13/0006* (2013.01)

(58) Field of Classification Search
CPC ................................. H02B 1/565; H05K 7/00
See application file for complete search history.

(56) References Cited

U.S. PATENT DOCUMENTS

| | | | | |
|---|---|---|---|---|
| 7,239,521 B2* | 7/2007 | Quero | .................... | H02B 1/043 361/725 |
| 7,535,717 B2* | 5/2009 | Lai | .......................... | G06F 1/181 361/727 |
| 8,018,724 B2* | 9/2011 | Jian | ...................... | H05K 7/1492 361/724 |

(Continued)

FOREIGN PATENT DOCUMENTS

| | | |
|---|---|---|
| JP | H0634326 A | 12/1994 |
| JP | 3164484 U | 12/2010 |

(Continued)

OTHER PUBLICATIONS

Unknown; "High Voltage Direct Current Transmission System (HVDC)"; Aug. 22-26, 2016; (15 pages).

*Primary Examiner* — Anthony Q Edwards
(74) *Attorney, Agent, or Firm* — K&L Gates LLP

(57) ABSTRACT

An apparatus of sliding a submodule includes a sliding rail part installed on one side of a cabinet; a submodule capable of being entered into or withdrawn from the cabinet; and a sliding guide part installed at one side of the submodule and slidingly moved by the sliding rail part. The sliding rail part may include a rail body, first and second extending parts extending from opposite ends of the rail body, and first and second sliding rails connected to the first and second extending parts respectively and protruding toward the sliding guide part.

17 Claims, 8 Drawing Sheets

(56) References Cited

U.S. PATENT DOCUMENTS

2005/0146855 A1* 7/2005 Brehm ................. H05K 7/1454
361/724
2006/0274508 A1* 12/2006 LaRiviere ............ H05K 7/1488
361/727
2008/0144293 A1* 6/2008 Aksamit .............. H05K 7/1489
361/727

FOREIGN PATENT DOCUMENTS

| JP | 5470832 B2 | 4/2014 |
| JP | 5578213 B2 | 8/2014 |
| KR | 100858060 B1 | 9/2008 |
| KR | 20140130316 A | 11/2014 |
| KR | 20150078487 A | 7/2015 |
| KR | 101623347 B1 | 6/2016 |
| KR | 101645471 B1 | 8/2016 |

* cited by examiner

APPARATUS OF SLIDING SUBMODULE

CROSS-REFERENCE TO RELATED APPLICATIONS

Pursuant to 35 U.S.C. § 119(a), this application claims the benefit of earlier filing date and right of priority to Korean Patent Application No. 10-2017-0054823 filed on Apr. 28, 2017, in the Korean Intellectual Property Office, the disclosure of which is hereby incorporated by reference in its entirety.

BACKGROUND

1. Field of the Invention

The present invention relates to an apparatus of sliding a submodule.

2. Discussion of Related Art

As an industry develops and the population increases, a demand for electric power increases sharply, but production of electric power is limited.

Accordingly, a power system to supply a demanding site stably with power generated at a production site without loss is increasingly becoming important.

A need for a flexible AC transmission system (FACTS) for improving power flow, grid voltage, and stability is growing. A static synchronous compensator (STATCOM) facility, which is a kind of power compensator called a 3rd generation in FACTS, is connected to a power system in parallel and compensates for reactive power and active power required in the power system.

FIG. 1 illustrates a general power system.

As shown in FIG. 1, a general power system 10 may include a power generating source 20, a power system 30, a load 40, and a plurality of power compensators 55.

The power generating source 20 refers to a place or facility for generating power, and may be understood as a producer that generates the power.

The power system 30 may refer to any facilities including a power line, an iron tower, a lightning arrester, an insulator, and the like that transmit power generated from the power generating source 20 to the load 40.

The load 40 refers to a place or facility that consumes power generated from the power generating source 20, and may be understood as a consumer that consumes the power.

The power compensator 55 may be a device that is associated with the power system 30 and compensates for corresponding active power or reactive power depending on supply or lack of active power or reactive power among power flowing to the power system 3.

Recently, a STATCOM facility of a modular multilevel converter (MMC) type tends to increase in the power compensator 5. The STATCOM facility of the MMC type includes a plurality of submodules, which are formed of various internal devices.

Accordingly, there is a difficulty in easily mounting a heavy submodule on a conventional power compensator. In addition, it is not easy to replace a submodule mounted on a conventional power compensator even if a problem occurs in the mounted submodule.

SUMMARY OF THE INVENTION

The present invention is directed to solving the problems described above and other problems.

According to another aspect of the present invention, there is provided an apparatus of sliding a submodule capable of easily entering/withdrawing the submodule.

According to an aspect of the present invention, there is provided an apparatus of sliding a submodule including: a sliding rail part installed on one side of a cabinet; a submodule capable of being entered into/withdrawn from the cabinet; and a sliding guide part installed on one side of the submodule and slidingly moved by the sliding rail part. The sliding rail part may include a rail body, first and second extending parts extending from opposite ends of the rail body, and first and second sliding rails connected to the first and second extending parts respectively and protruding toward the sliding guide part.

DETAILED DESCRIPTION OF THE EMBODIMENTS

Figure 1:
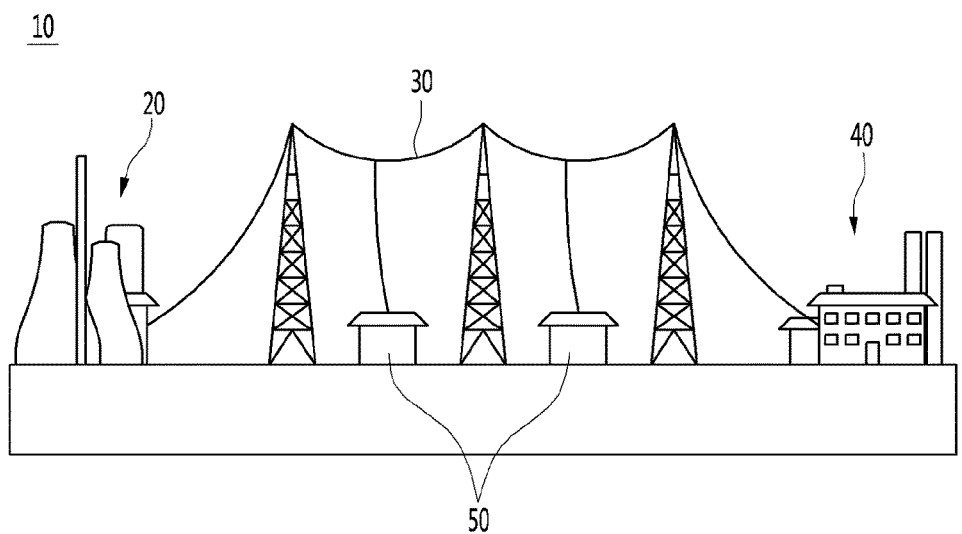
FIG. 1 illustrates a general power system.

Hereinafter, embodiments disclosed in the present invention will be described in detail with reference to the accompanying drawings, wherein like reference numerals are used to designate identical or similar elements, and redundant description thereof will be omitted. The suffix "module" and "part" of the component used in the following description are to be granted or mixed in consideration of the ease of preparing the specification alone and do not have any meaning or role to be distinguished from each other. In describing embodiments of the present disclosure, when detailed description of the related known arts is deemed to unnecessarily blur the gist of the present disclosure, the detailed description will be omitted. In addition, the accompanying drawings are only for facilitating understanding of the embodiments disclosed in this description, so that the technical idea disclosed in the present description is not limited by the accompanying drawings, but should be understood to include all modifications, equivalents and alternatives falling within the spirit and scope of the present invention.

Figure 2:
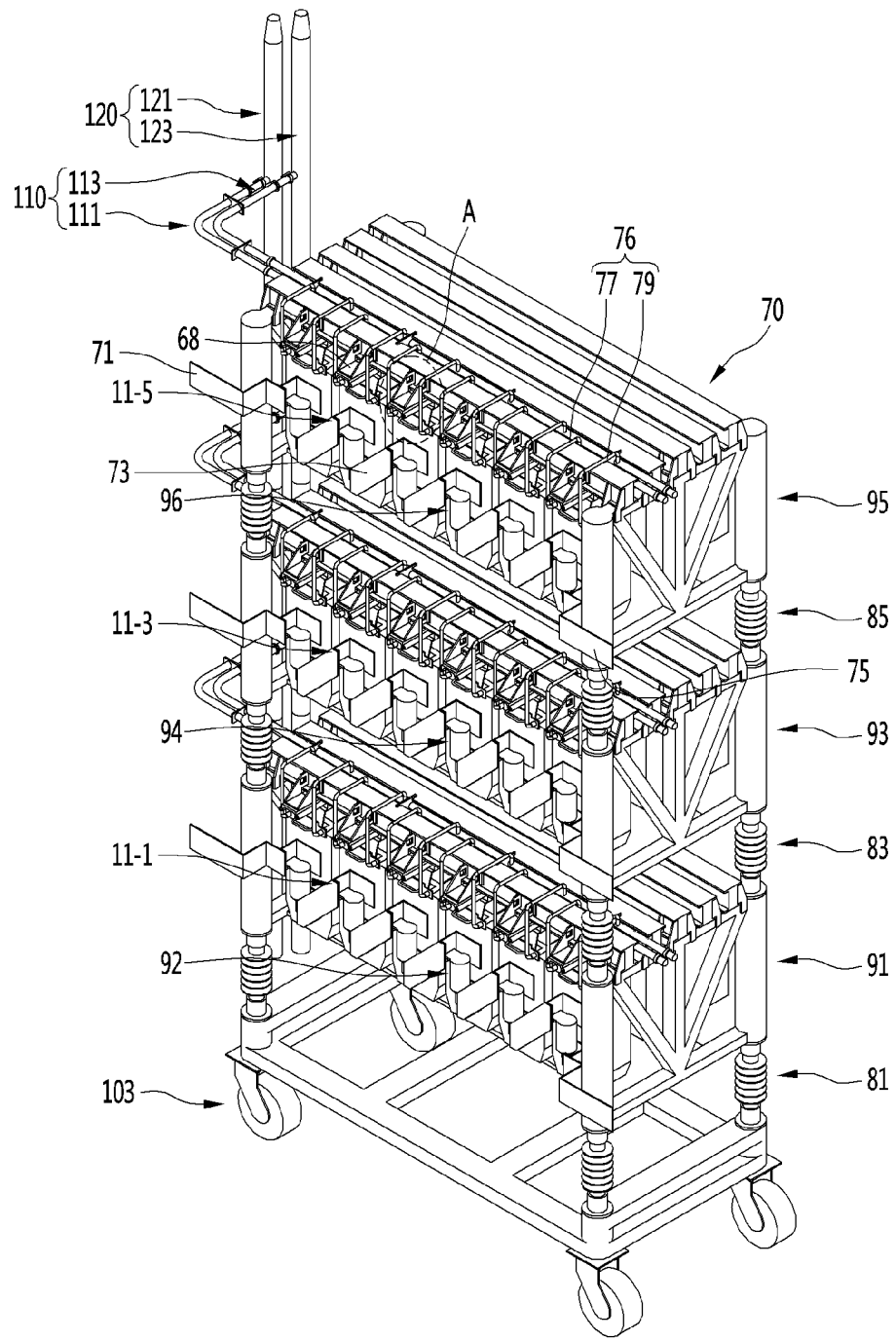
FIG. 2 illustrates a modular multilevel converter (MMC)-based power converter according to the present invention.

FIG. 2 illustrates a modular multilevel converter (MMC)-based power compensator according to the present invention.

Referring to FIG. 2, a power compensator according to the present invention may be provided in a frame 70. The power compensator according to the present invention may include a plurality of insulating units 81, 83 and 85, and a plurality of cabinets 91, 93 and 95 stacked each other. For example, a first cabinet 91 may be disposed on a first insulating unit 81, a second insulating unit 83 may be disposed on the first cabinet 91, and a second cabinet 93 may be disposed on the second insulating unit 83. In addition, a third insulating unit 85 may be disposed on the second cabinet 93 and a third cabinet 95 may be disposed on the third insulating unit 85.

The insulating units 81, 83 and 85 may be a space in which at least one or more insulators are installed. The cabinets 91, 93 and 95 may be an accommodating space in which a plurality of submodule units 11-1, 11-3 and 11-5 are accommodated. Each of the submodule units 11-1, 11-3 and 11-5 may include a plurality of submodules 92, 94 and 96 connected in series to each other.

The insulating units 81, 83 and 85 located between the cabinets 91, 93 and 95 may insulate the submodule units 11-1, 11-3 and 11-5 accommodated in each of the cabinets 91, 93 and 95.

The first submodule unit 11-1 accommodated in the first cabinet 91 may include a plurality of submodules 92 for converting a voltage of the first phase of a three-phase AC voltage, for example, a voltage of an A-phase. The second submodule unit 11-3 accommodated in the second cabinet 93 may include a plurality of submodules 94 for converting a voltage of the second phase of a three-phase AC voltage, for example, a voltage of a B-phase. The third submodule unit 11-5 accommodated in the third cabinet 95 may include a plurality of submodules 96 for converting a voltage of the third phase of a three-phase AC voltage, for example, a voltage of a C-phase.

An input busbar 71 is connected to the first submodule among the plurality of submodules 92, 94 and 96 in each of the submodule units 11-1, 11-3 and 11-5, an output busbar 75 is connected to the last submodule, and a connection busbar 73 may be connected to between other submodules.

Each of the submodules 92, 94 and 96 may be entered into accommodating spaces of the cabinets 91, 93 and 95 by a sliding rail part 117. The sliding rail part 117 may be installed on upper sides of the cabinets 91, 93 and 95, but is not limited thereto.

Three cabinets 91, 93 and 95 and three insulating units 81, 83 and 85 are illustrated in FIG. 2 for convenience of description, but the number of the cabinets 91, 93 and 95 and the number of the insulating units 81, 83 and 85 may be variously changed depending on needs of an operator, which does not limit the scope of the present invention.

A moving member for moving the frame 70 may be installed in a lower part of the frame 70, but is not limited thereto. For example, a wheel 103 may be used for the moving member, but is not limited thereto.

The frame 70 having a heavy load may be easily moved to a desired place by the wheel 103.

If the frame 70 is permanently fixed in a specific place, the wheel 103 may not be needed.

The power compensator of an embodiment may include a main pipe 120 installed at one side of the frame 70, a plurality of branch pipes 110 branching from the main pipe 120 to each of the cabinets 91, 93 and 95, and a plurality of sub-branch pipes 76 branching from each of the branch pipes 110 and connected to each of the submodules 92, 94 and 96.

The main pipe 120 may include a first main pipe 121 for charging cooling water and a second main pipe 123 for discharging the cooling water. The branch pipe 110 may include a first branch pipe 111 connected to the first main pipe 121 to enter cooling water and a second branch pipe 113 connected to the second main pipe 123 to discharge the cooling water. The sub-branch pipe 76 may include a first sub-branch pipe 77 connecting the first branch pipe 111 and an inlet side of each of the submodules 92, 94 and 96 to enter cooling water to the inlet side of each of the submodules 92, 94 and 96, and a second sub-branch pipe 79 connecting the second branch pipe 113 and an outlet side of each of the submodules 92, 94 and 96 to discharge the cooling water from the outlet side of each of the submodules 92, 94 and 96.

The main pipe 120 and the branch pipe 110 are formed of a stainless steel material and the sub-branch pipe 76 is formed of a polyvinylidene fluoride-based material.

A diameter of the branch pipe 110 may be smaller than that of the main pipe 120, and a diameter of sub-branch pipe 76 may be smaller than that of the branch pipe 110. Therefore, the cooling water discharged from the first main pipe 121 is entered into the first branch pipe 111 installed in each of the cabinets 91, 93 and 95, and the cooling water of the first branch pipe 111 may be entered into each of the submodules 92, 94 and 96 through the first sub-branch pipe 77 connected to the inlet side of each of the submodules 92, 94 and 96. Heat generated in a plurality of switching modules (not shown) installed in each of the submodules 92, 94 and 96 may be easily discharged to outside by the cooling water entered into the submodules 92, 94 and 96. Each of the submodules 92, 94 and 96 may be provided with a cooling plate on which cooling water may circulate, for example, a zigzag-shaped pipe is formed.

The cooling water may be discharged to the second sub-branch pipe 79 connected to the outlet side of each of the submodules 92, 94 and 96, and be discharged to the second main pipe 123 via the second branch pipe 113 installed in each of the cabinets 91, 93 and 95.

However, this is for convenience of description, and the branch pipe 110 may be deformed into another form rather than a straight line as required, which does not limit the scope of the present invention.

Figure 3:
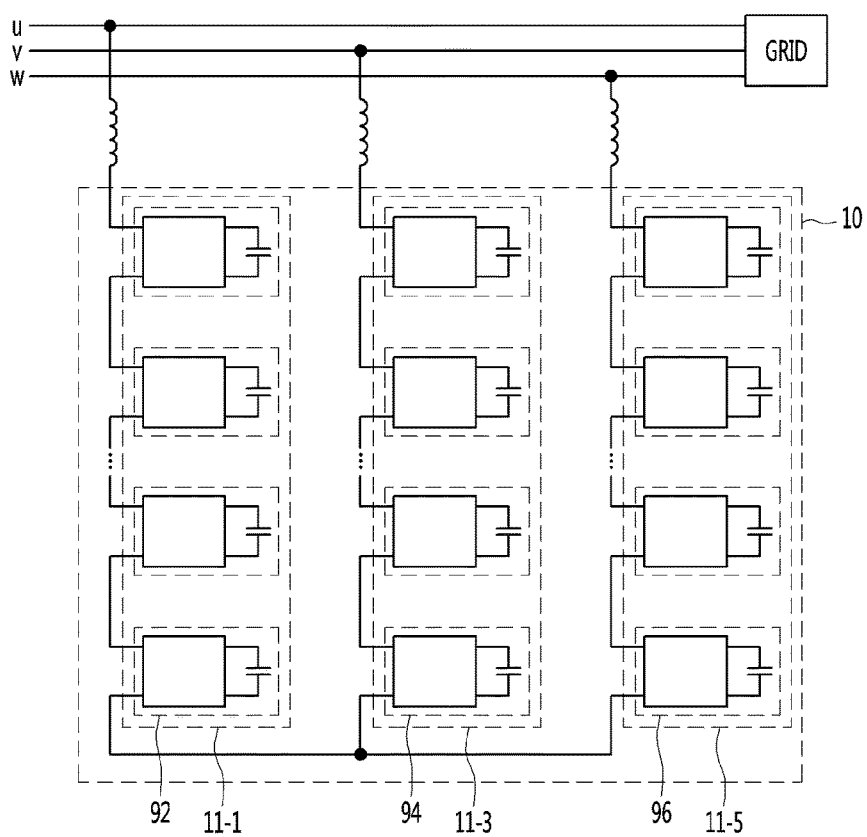
FIG. 3 illustrates a circuit diagram of the MMC-based power converter according to the present invention.

FIG. 3 illustrates a circuit diagram of the MMC-based power converter according to the present invention.

As shown in FIG. 3, the MMC-based power compensator 10 may include a plurality of submodules 92, 94 and 96 connected in series for each of phases. Active power or reactive power may be supplied to a power system, or active power or reactive power may be absorbed from the power system by an operation of the plurality of submodules 92, 94 and 96.

FIG. 3 illustrates a Y type power compensator, but a Δ type power compensator may also be employed in the present invention.

The plurality of submodules 92, 94 and 96 provided in each of phases may be defined as one valve, but is not limited thereto.

Figure 4:
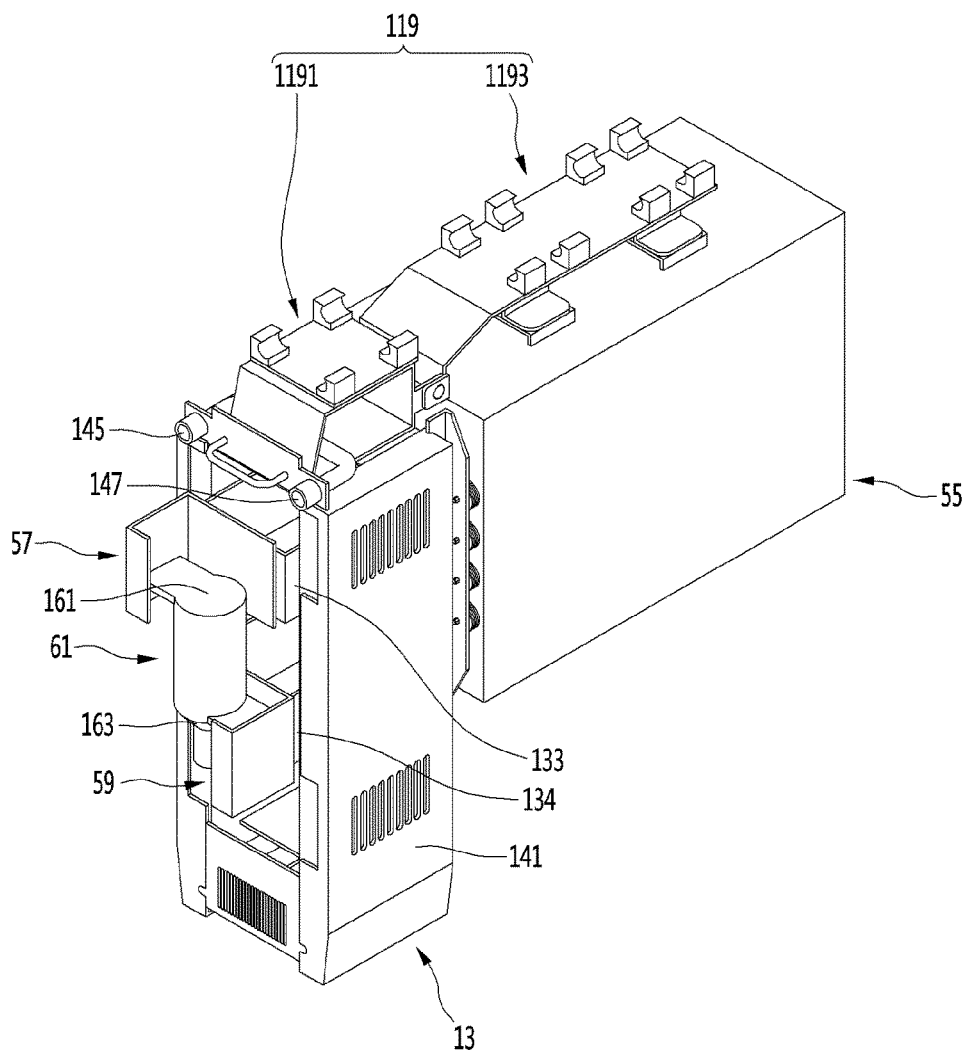
FIG. 4 is a perspective view illustrating a submodule according to one embodiment of the present invention.

FIG. 4 is a perspective view illustrating a submodule according to one embodiment of the present invention.

Referring to FIG. 4, the submodules 92, 94 and 96 according to one embodiment of the present invention may include a power pack 13 and a capacitor pack 55.

The power pack 13 and the capacitor pack 55 may be electrically connected. The capacitor pack 55 may be entered and discharged by a switching operation of the power pack 13.

The capacitor pack 55 may include a case 141 and a capacitor element 56 installed in the case 141. The capacitor element 56 stores energy (electric power) input to the submodules 92, 94 and 96, and the energy may be used as a power source for driving various devices installed in the submodules 92, 94 and 96 and may be supplied to the power system as reactive power.

The capacitor pack 55 may be electrically connected to the rear of the power pack 13.

First and second input busbars 57 and 59 may be installed so as to protrude to the outside, that is, to the front of the power pack 13. The first and second input busbars 57 and 59 may be connected to a plurality of switching modules installed in the case 141 through the case 141. The first and second input busbars 57 and 59 may be formed of a conductive material having excellent electrical conductivity.

The active power or the reactive power absorbed from the power system may be input through the first and second input busbars 57 and 59, or the energy entered into the capacitor element 56 may be output to the power system as active power or reactive power.

Accordingly, the first and second input busbars 57 and 59 may also be named as, in other words. first and second input terminals.

The first and second input busbars 57 and 59 may have a shape bent at least once or more.

The first and second input busbars 57 and 59 may be electrically connected by a bypass switch (BPS) 61. That is, a first switch terminal 161 of the bypass switch 61 may be connected to the first input busbar 57, and a second switch terminal 163 of the bypass switch 61 may be connected to the second input busbar 59.

The first input busbar 57 may be installed on a first region of a front surface of the case 141, and the second input busbar 59 may be installed on a second region located below the first region. The first region and the second region may be located vertically, but is not limited thereto.

The bypass switch 61 may be formed in a long cylindrical shape between the first switch terminal 161 and the second switch terminal 163. The first switch terminal 161 may have a first protrusion portion protruding in a first horizontal direction from an upper side of the bypass switch 61, and the second switch terminal 163 may have a second protrusion portion protruding in a second horizontal direction opposite to the first horizontal direction from a lower side of the bypass switch 61.

The first input busbar 57 may be fastened to the first protrusion portion of the first switch terminal 161 using a screw, and the second input busbar 59 may be fastened to the second protrusion portion of the second switch terminal 163 using a screw.

Accordingly, the first input busbar 57 fastened to the first protrusion portion of the first switch terminal 161 on the basis of a vertical axis of the bypass switch 61 is located on a first side of the bypass switch 61, that is on the left side of the bypass switch 61, and the second input busbar 59 fastened to the second protrusion portion of the second switch terminal 163 is located on a second side of the bypass switch 61, that is on the right side of the bypass switch 61.

The bypass switch 61 may be disposed to be spaced apart from the front surface of the case 141 in a forward direction.

The bypass switch 61 may electrically short between the first and second input busbars 57 and 59 when an error occurs in the device including the switching module in the power pack 13 so as to eliminate the submodule including the power pack 13 by bypassing a current from the first input busbar 57 to the second input busbar 59 via the bypass switch 61. Here, the term "elimination" may refer that a corresponding submodule is not be used. By such a bypass operation, normal operation may be possible even if a specific power pack fails.

The bypass switch 61 is installed outside the power pack 13, and heat generated by the bypass switch 61 is directly discharged to outside. Accordingly, there is no need to add a separate heat radiation member for radiating the heat of the bypass switch 61, thereby being economical.

A rear surface of the power pack 13 and the capacitor pack 55 may be fastened to each other by first and second connection busbars 63. The power pack 13 and the capacitor pack 55 may be electrically connected via the first and second connection busbars 63. The first and second connection busbars 63 may protrude to the outside of the power pack 13, for example, to the rear of the power pack 13. The connection relation to this will be described later in detail.

Corresponding to the sliding rail part 117 installed on upper sides of the cabinets 91, 93 and 95, a first sliding guide part 1191 to be slidingly moved when the power pack 13 is entered into the cabinets 91, 93 and 95 may be provided on an upper side of the power pack 13.

Likewise, corresponding to the sliding rail part 117 installed on the upper sides of the cabinets 91, 93 and 95, a second sliding guide part 1193 to be slidingly moved when the capacitor pack 55 is entered into the cabinets 91, 93, and 95 may be provided on an upper side of the capacitor pack 55.

The first and second sliding guide parts 1191 and 1193 may be collectively named as a sliding guide part 119.

As shown in FIG. 4, for convenience of description, the first sliding guide part 1191 and the second sliding guide part 1193 are provided on the upper side of the power pack 13 and on the upper side of the capacitor pack 55, respectively, but are not limited thereto. If necessary, the first sliding guide part 1191 and the second sliding guide part 1193 may be deformed so as to be provided on a lower side and/or a side surface of the power pack 13 and on a lower side and/or a side surface of the capacitor pack 55 respectively, which does not limit the scope of the present invention. In such a case, the sliding rail part 117 may be installed at bottom portions and/or side portions of the cabinets 91, 93 and 95.

Each of the unexplained reference numerals 145 and 147 is an inlet terminal and an outlet terminal through which cooling water is input and output. The inlet terminal 145 may be fastened to the first sub-branch pipe 77 shown in FIG. 2 and the outlet terminal 147 may be fastened to the second sub-branch pipe 79.

Figure 5:
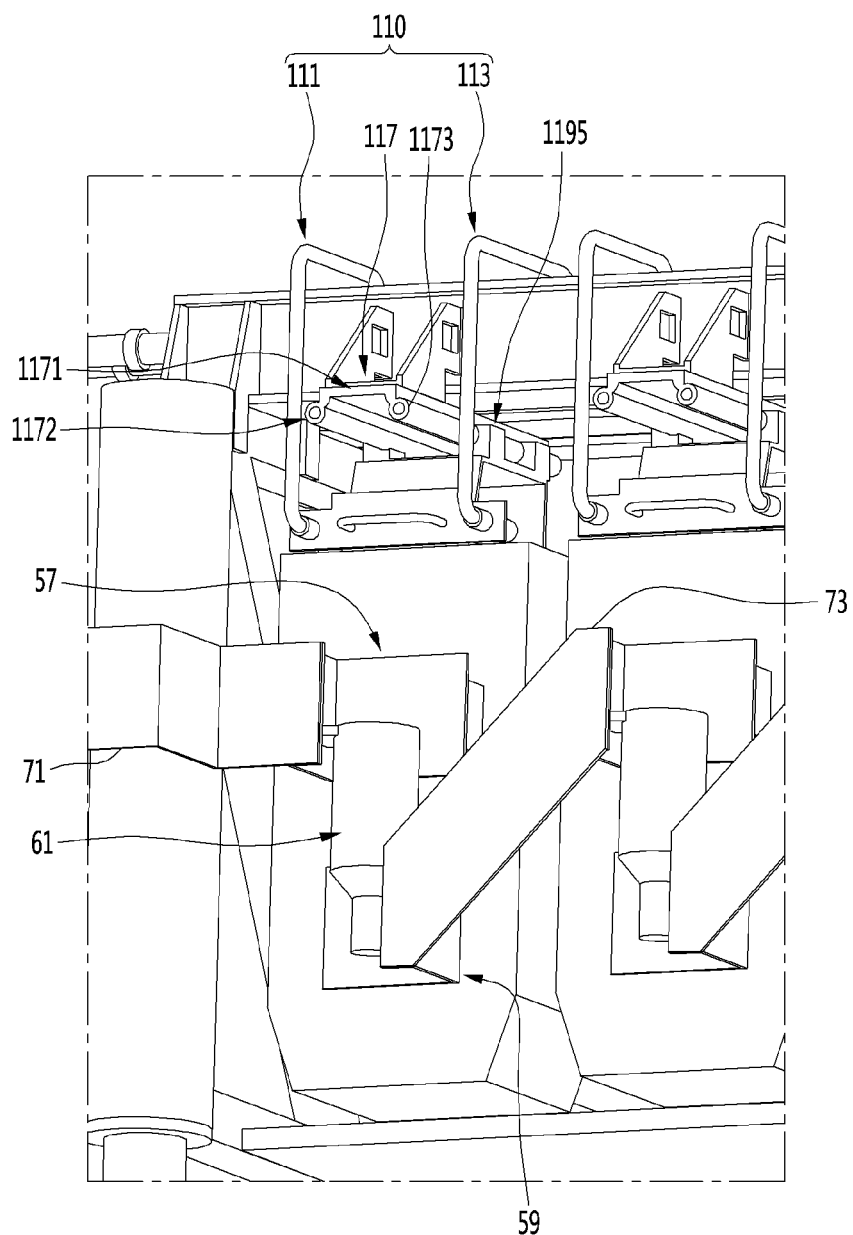
FIG. 5 illustrates an apparatus of sliding a submodule according to one embodiment of the present invention.
Figure 6A:
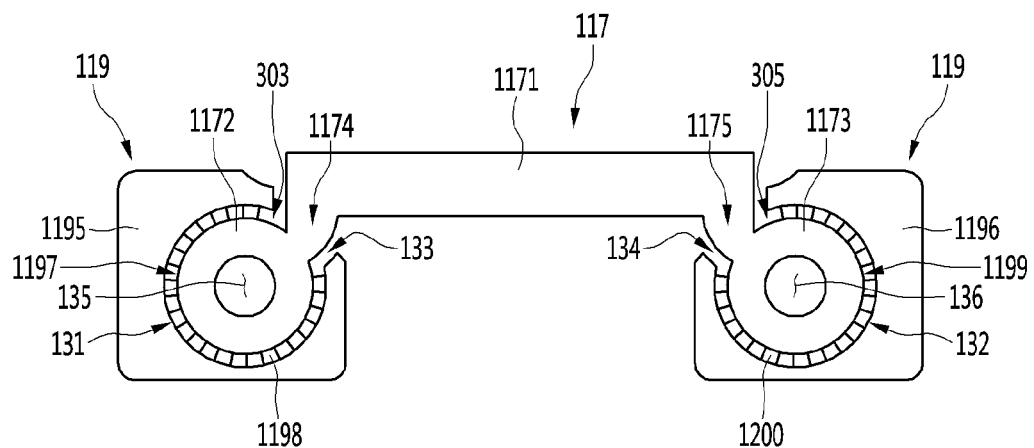
FIG. 6A illustrates a state in which a sliding rail part is engaged with a sliding guide part according to one embodiment of the present invention.
Figure 6B:
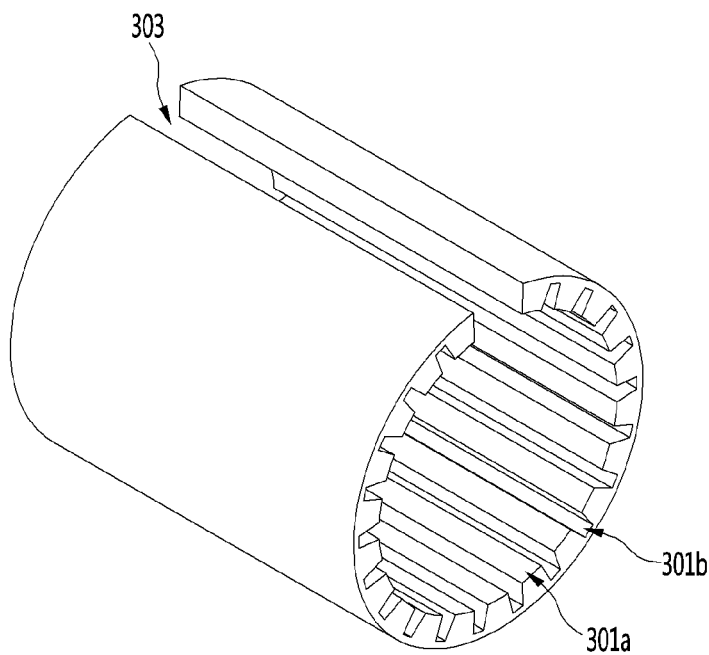
FIG. 6B illustrates an oil-free bearing of FIG. 6A.

FIG. 5 illustrates an apparatus of sliding a submodule according to one embodiment of the present invention, FIG. 6A illustrates a state in which a sliding rail part is engaged with a sliding guide part according to one embodiment of the present invention, and FIG. 6B illustrates an oil-free bearing of FIG. 6A.

Referring to FIG. 5, the apparatus of sliding a submodule according to one embodiment of the present invention may include a sliding rail part 117 installed on one side of each of the cabinets 91, 93 and 95, submodules 92, 94 and 96 entered into each of the cabinets 91, 93 and 95 or withdrawn from each of the cabinets 91, 93 and 95, and a sliding guide part 119 installed on one side of the submodules 92, 94 and 96, and slidingly moved by the sliding rail part 117.

For example, the sliding rail part 117 may be installed on an upper side of each of the cabinets 91, 93 and 95, but may be installed on a lower side and/or side surfaces of each of the cabinets 91, 93 and 95.

For example, the sliding guide part 119 may be installed on upper sides of the submodules 92, 94 and 96, but may be installed on lower sides and/or side surfaces of the submodules 92, 94 and 96.

The submodules 92, 94 and 96 may include a power pack 13 and a capacitor pack 55. The sliding guide part 119 may include a first sliding guide part 1191 installed on one side of the power pack 13 and a second sliding guide part 1193 installed on one side of the capacitor pack 55.

The first and second sliding guide parts 1191 and 1193 may be installed to protrude in the same direction. For example, both the first and second sliding guide parts 1191 and 1193 may be installed to protrude toward an upper direction.

When entered into the cabinets 91, 93 and 95, the capacitor pack 55 of the submodules 92, 94 and 96 is firstly entered into the cabinets 91, 93 and 95, and then the power pack 13 may be subsequently entered into the cabinets 91, 93 and 95.

When withdrawn from the cabinets 91, 93 and 95, the power pack 13 of the submodules 92, 94 and 96 is withdrawn from the cabinets 91, 93 and 95, and then the capacitor pack 55 may be subsequently withdrawn from the cabinets 91, 93 and 95.

As shown in FIG. 6A, the sliding rail part 117 may be configured to include a rail body 1171, first and second extending parts 1174 and 1175 extending from opposite ends of the rail body 1171, and first and second sliding rails 1172 and 1173 connected to the first and second extending parts 1174 and 1175 and configured to protrude toward the sliding guide parts 119 of the submodules 92, 94 and 96.

The rail body 1171, the first and second extending parts 1174 and 1175, and the first and second sliding rails 1172 and 1173 may be formed of the same material and integrally formed.

The first and second extending parts 1174 and 1175 may extend downward from the opposite ends of the rail body 1171, but are not limited thereto.

The first and second sliding rails 1172 and 1173 may be disposed on an outer side from a vertical axis of the first and second extending parts 1174 and 1175, but is not limited thereto. For example, the first sliding rail 1172 may be disposed on a first outer side, that is, the left side, from a vertical axis of the first extending part 1174. For example, the second sliding rail 1173 may be disposed on a second outer side, that is, the right side, from a vertical axis of the second extending part 1175. Empty spaces 135 and 136 are formed inside each of the first and second sliding rails 1172 and 1173 so that weights of the first and second sliding rails 1172 and 1173 may be minimized There is no need to form the empty spaces 135 and 136 of the first and second sliding rails 1172 and 1173.

As described above, the sliding rail part 117 is installed in the cabinets 91, 93 and 95, and the sliding guide part 119 capable of slidingly moving with the sliding rail part 117 may be installed on the submodules 92, 94 and 96. After fitted to and combined with the sliding rail part 117 installed on one side of the cabinets 91, 93 and 95, the sliding guide part 119 may be slidingly moved to be entered into the cabinets 91, 93 and 95, or withdrawn from the cabinets 91, 93 and 95.

Thus, the submodules 92, 94 and 96, to which the power pack 13 and the capacitor pack 55 are fastened, may be easily entered into the cabinets 91, 93 and 95 or withdrawn from the cabinets 91, 93 and 95. In addition, when a problem occurs in at least one of the plurality of submodules 92, 94 and 96, the submodules 92, 94 and 96 in which the problem occurred may be easily replaced. As described above, since each of the submodules 92, 94 and 96 is heavy and each of the submodules 92, 94 and 96 is accommodated in a first direction and at the same time is stacked in a second direction perpendicular to the first direction, each of the submodules 92, 94 and 96 may be located higher than a person's height based on the person's height. Accordingly, the sliding rail part 117 and the sliding guide part 119 as described above are provided, thereby blocking the occurrence of an accident when the submodules 92, 94 and 96 accommodated in the cabinets 91, 93, 95 are withdrawn.

In addition, when some of the power packs 13 of the submodules 92, 94 and 96 have in failure or are broken, the submodules 92, 94 and 96 are withdrawn from the cabinets 91, 93 and 95, and only the broken power pack 13 is disengaged from the sliding rail part 117 after the failed power pack 13 is disengaged from the capacitor pack 55. After a new power pack 13 is fitted into the sliding rail part 117 and fastened to the capacitor pack 55, the submodules 92, 94 and 96 composed of the new power pack 13 and the capacitor pack 55 may be returned to accommodating spaces of the cabinets 91, 93 and 95 via the sliding rail part 117.

Meanwhile, in FIG. 5, for convenience of description, the sliding rail part 117 is disposed on an upper surface of the cabinets 91, 93 and 95 on the basis of an accommodating space for accommodating the submodules 92, 94 and 96 in the cabinets 91, 93 and 95. In correspondence with this, the sliding guide parts 119 are disposed on upper surfaces of the submodules 92, 94 and 96, respectively.

However, it suffices that the submodules 92, 94 and 96 accommodated in the cabinets 91, 93 and 95 may slide in relation to the cabinets 91, 93 and 95. Depending on the needs of an operator, the sliding rail part 117 may be disposed on a lower surface on the basis of the accommodating space for accommodating the submodules 92, 94 and 96 in the cabinets 91, 93 and 95. In correspondence with this, the sliding guide parts 119 may be changed to be disposed on lower surfaces of the submodules 92, 94 and 96, respectively.

Further, the sliding rail part 117 may be disposed on both the upper surface and the lower surface on the basis of the accommodating space for accommodating the submodules 92, 94 and 96 in the cabinets 91, 93 and 95. In correspondence with this, the sliding guide part 119 may be changed to be disposed on both the upper and lower surfaces of the submodules 92, 94 and 96.

In addition, the sliding rail part 117 may be disposed on a side surface on the basis of the accommodating space for accommodating the submodules 92, 94 and 96 in the cabinets 91, 93 and 95. In correspondence with this, the sliding guide part 119 may be changed to be disposed on side surfaces of the submodules 92, 94 and 96, which does not limit the scope of the present invention.

The sliding guide part 119 may include first and second guide bodies 1195 and 1196, respectively having first and second recessed regions 131 and 132, and first and second linear guides 1198 and 1200 fixedly mounted on the first and second recessed regions 131 and 132 respectively and having first and second rail accommodating portions 1197 and 1199.

Each of the first and second recessed regions 131 and 132 may be a recessed space having an inner circumferential surface corresponding to an outer circumferential surface of each of the first and second linear guides 1198 and 1200.

First and second sliding rails 1172 and 1173 of the sliding rail part 117 may be respectively accommodated in the first and second rail accommodating portions 1197 and 1199 of the first and second linear guides 1198 and 1200.

Each of the first and second guide bodies 1195 and 1196 may be fastened to be fixed to one side of the submodules 92, 94 and 96. Specifically, the first and second guide bodies 1195 and 1196 of the first sliding guide part 1191 in FIG. 4 may be fastened to be fixed to one side of the power pack 13, and the first and second guide bodies 1195 and 1196 of the second sliding guide part 1193 in FIG. 4 may be fastened to be fixed to one side of the capacitor pack 55.

First and second openings 133 and 134 communicating with outside may be formed on one side of each of the first and second recessed regions 131 and 132 of the first and second guide bodies 1195 and 1196.

Each of the first and second recessed regions 131 and 132 has a circular shape when viewed from the front, but is not limited thereto.

The first and second linear guides 1198 and 1200 may be oil-free bearings. The oil-free bearings are mechanical parts that move or transmit force in various motions such as rotation, reciprocating, side pressure, and angular oscillation operation by using slipperiness under load and power regardless of shape and material. In particular, the oil-free bearing may be operated by directly contacting the axis or the moving surface of a moving body.

The first and second linear guides 1198 and 1200 are provided as an oil-free bearing, and thus no lubrication can be realized in locations where it is difficult, undesirable or ineffective to lubricate such as places with high-temperature, low-temperature, corrosive atmosphere, foreign matter inflow, impact load and vibration, a place structurally impossible to lubricate, or the like. Accordingly, it is possible to improve performance of the sliding movement of the sliding rail part 117 and the sliding guide part 119, to reduce refueling manpower and cost, and further to improve productivity.

As shown in FIG. 6B, each of the first and second linear guides 1198 and 1200 may have a protrusion 301a and a groove 301b alternately disposed along an inner circumferential surface thereof. In addition, third and fourth openings 303 and 305 communicating with outside may be formed on one side of each of the first and second linear guides 1198 and 1200, respectively.

The third opening 303 of the first linear guide 1198 may be connected to the first opening 133 of the first guide body 1195, and the fourth opening 305 of the second linear guide 1200 may be connected to the second opening 134 of the second guide body 1196.

The third opening 303 of the first linear guide 1198 has an opening width at least greater than that of the first opening 133 of the first guide body 1195, but is not limited thereto. The fourth opening 305 of the second linear guide 1200 has an opening width at least greater than that of the second opening 134 of the second guide body 1196, but is not limited thereto.

Each of the first and second rail accommodating portions 1197 and 1199 may have a space, which is recessed into the first and second guide bodies 1195 and 1196, and may have an inner circumferential surface corresponding to an outer circumferential surface of each of the first and second sliding rails 1172 and 1173. Each of the first and second rail accommodating portions 1197 and 1199 has a circular shape when viewed from the front, but is not limited thereto. Each of the first and second rail accommodating portions 1197 and 1199 may vary in shape depending on the shape of outer surfaces of the first and second sliding rails 1172 and 1173.

Accordingly, the first and second sliding rails 1172 and 1173 of the sliding rail part 117 may be accommodated in the first and second rail accommodating portions 1197 and 1199 of the sliding guide part 119, and the sliding rail part 117 and the sliding guide part 119 can slide.

When the submodules 92, 94 and 96 are entered into the cabinets 91, 93 and 95, the first and second sliding rails 1172 and 1173 of the sliding rail part 117 can be fitted to be accommodated in each of the first and second rail accommodating portions 1197 and 1199 of the sliding guide part 119 disposed on one side of the submodules 92, 94 and 96.

The first sliding rail 1172 of the sliding rail part 117 may be accommodated in the first rail accommodating portion 1197 of the sliding guide part 119, and the second sliding rail 1173 of the sliding rail part 117 may be accommodated in the second rail accommodating portion 1199 of the sliding guide part 119.

In addition, the first extending part 1174 of the sliding rail part 117 may be located in the first and third openings 133 and 303 of the sliding guide part 119, and the second extending part 1175 of the sliding rail part 117 may be located in the second and fourth openings 134 and 305 of the sliding guide part 119.

After the first and second linear guides 1198 and 1200 of the sliding guide part 119 is fitted to and combined with the first and second sliding rails 1172 and 1173 of the sliding rail part 117, the submodules 92, 94 and 96 may be slidingly moved into the accommodating spaces of the cabinets 91, 93 and 95. Accordingly, the submodules 92, 94 and 96 fastened to the sliding guide part 119 are also moved to the accommodating spaces of the cabinets 91, 93 and 95 to be easily seated in the accommodating spaces of the cabinets 91, 93 and 95.

Figure 7A:
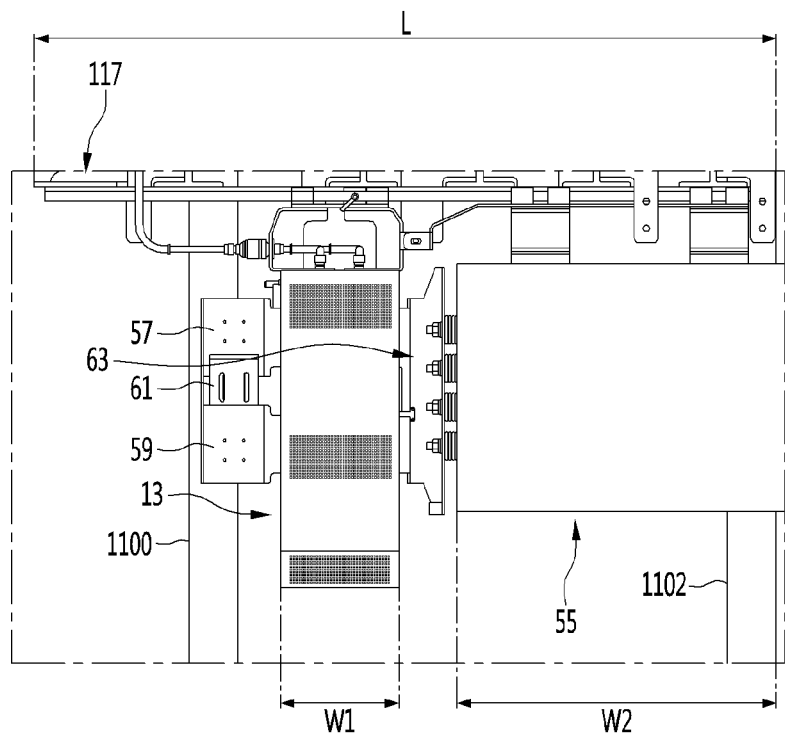
FIGS. 7A and 7B illustrate a submodule entered into/withdrawn from the inside of a cabinet according to one embodiment of the present invention.
Figure 7B:
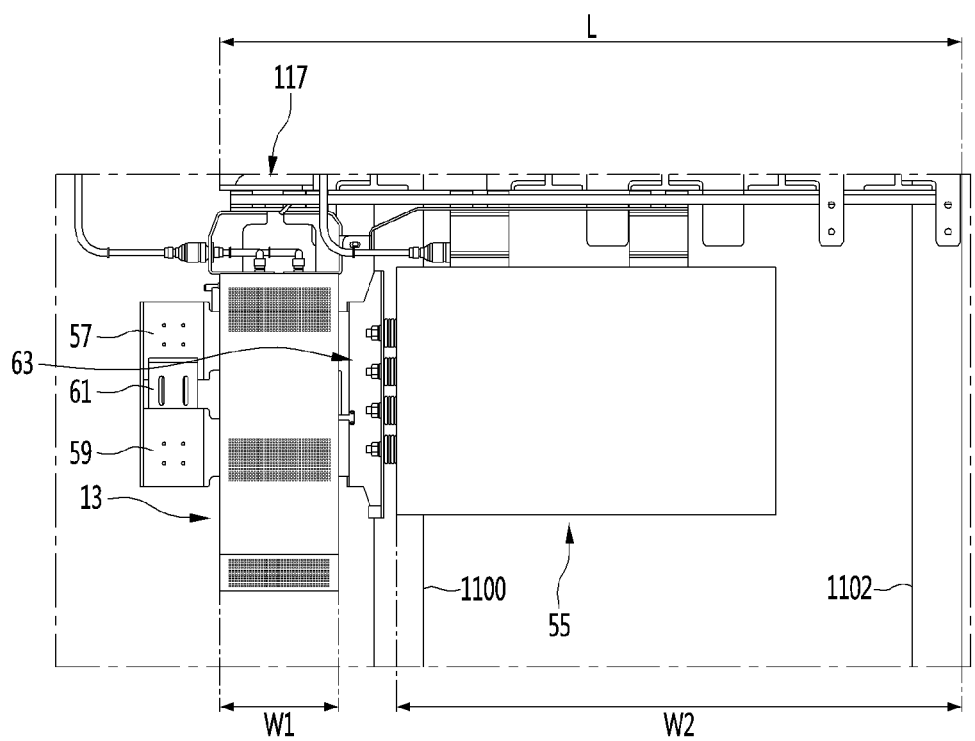

FIGS. 7A and 7B illustrate a submodule entered into/withdrawn from the inside of a cabinet according to one embodiment of the present invention.

As shown in FIG. 7A, two or more first vertical supports 1100 may be installed on a front side of the frame 70 and two or more second vertical supports 1102 may be installed on a rear side of the frame 70. Although not shown, a plurality of horizontal supports (not shown) for fastening between the first and second vertical supports 1100 and 1102 may be installed.

The submodules 92, 94 and 96 may be entered into the accommodating spaces of the cabinets 91, 93 and 95. In such a case, a rear surface of the capacitor pack 55 of the submodules 92, 94 and 96 may be coincident with or close to a location of the second vertical support 1102. The rear side of the capacitor pack 55 of the submodules 92, 94 and 96 may located to be spaced apart at a predetermined length from a front surface of the power pack 13 of the submodules 92, 94 and 96.

Assuming that a width of the power pack 13 is W1, and a width of the capacitor pack 55 is W2, a length L of the sliding rail part 117 may be expressed by Equation 1.

$$L \geq W1 + W2 + \alpha, \qquad \text{[Equation 1]}$$

where α may be equal to or greater than the sum of the width of the power pack 13 and a width of the first or second connection busbar 63 for connecting the power pack 13 and the capacitor pack 55, but is not limited thereto.

As shown in FIG. 7B, the submodules 92, 94 and 96 may be withdrawn from the accommodating spaces of the cabinets 91, 93 and 95.

For example, when the power pack 13 of the submodules 92, 94 and 96 is broken and needs to be replaced, the submodules 92, 94 and 96 may be withdrawn from the accommodating spaces of the cabinets 91, 93 and 95.

The submodules 92, 94 and 96 may be withdrawn such that the rear surface of the power pack 13 of the submodules 92, 94 and 96 can be located at least ahead of the front of first vertical support 1100. That is, when the power pack 13 of the submodules 92, 94 and 96 is withdrawn to a front end of the sliding rail part 117, the power pack 13 of the submodules 92, 94 and 96 may be located at least ahead of the front of the first vertical support 1100. Then, the power pack 13 may be separated from the sliding rail part 117 after the power pack 13 is disengaged from the capacitor pack 55. Next, after a new power pack 13 is combined with the sliding rail part 117 and fastened to the capacitor pack 55, the new power pack 13 and the submodules 92, 94 and 96 composed of the existing capacitor pack are entered into the accommodating spaces of the cabinets 91, 93 and 95, and thus the power pack 13 can be easily replaced.

In addition, only the power pack 13 of the submodules 92, 94 and 96 may be withdrawn to be located outside the cabinets 91, 93 and 95, and thus interference of the cabinets 91, 93 and 95 can be prevented at the time of replacing the power pack 13, and the replacement operation of the power pack 13 can be easy.

This is, in the case of the submodules 92, 94 and 96, since most of the problems occur in the power pack 13, it is necessary to separate and replace only the power pack 13 from the submodules 92, 94 and 96, not the entire submodules 92, 94 and 96. Accordingly, only the power pack 13 of the submodules 92, 94 and 96 is located outside the cabinets 91, 93 and 95, so that the work efficiency of the operator can be improved.

The effects of the apparatus of sliding a submodule according to the present invention will be described below.

According to at least one of the embodiments of the present invention, the sliding rail part is provided on one side of the cabinet and the sliding guide part is provided on one side of the submodule, and thus the submodule can be easily entered into or withdrawn from the cabinet.

According to at least one of the embodiments of the present invention, an oil-free bearing is disposed between the rail accommodating portion of the sliding guide part and a rail of the sliding rail part accommodated in the rail accommodating portion, and thus the sliding movement of the sliding guide part and the sliding rail part can be maintained without continuous supply of oil.

According to at least one of the embodiments of the present invention, the sliding rail part has a length greater than at least the width of the submodule, and thus when the submodule has a problem with the power pack, the power pack can be easily separated and replaced.

The above detailed description should not be construed restrictively in all aspects and should be regarded as illustrative. The scope of the present invention should be determined by reasonable interpretation of the accompanying claims and all changes within the equivalent scope of the present invention are within the scope of the present invention.

What is claimed is:
1. An apparatus of sliding a submodule, comprising:
a sliding rail part installed on one side of a cabinet;
a submodule capable of being entered into or withdrawn from the cabinet; and
a sliding guide part installed on one side of the submodule and slidingly moved by the sliding rail part,
wherein the sliding rail part comprises a rail body, first and second extending parts extending from opposite ends of the rail body, and first and second sliding rails connected to the first and second extending parts, respectively and protruding toward the sliding guide part.

2. The apparatus of claim 1, wherein the sliding rail part is installed on at least one of an upper side, a lower side, and side surfaces of the cabinet.

3. The apparatus of claim 1, wherein the submodule comprises a power pack and a capacitor pack fastened to the power pack, and the sliding guide part comprises a first sliding guide part installed on one side of the power pack and a second sliding guide part installed on one side of the capacitor pack.

4. The apparatus of claim 3, wherein the sliding rail part is represented by the following equation:

$L \geq W1 + W2 + \alpha$ wherein W1 is a width of the power pack, W2 is a width of the capacitor pack, and α is equal to or greater than a sum of the width of the power pack and a width of a connection busbar connecting the power pack and the capacitor pack.

5. The apparatus of claim 1, wherein the first sliding rail is disposed on a first side from a vertical axis of the first extending part, and the second sliding rail is disposed on a second side from a vertical axis of the second extending part.

6. The apparatus of claim 1, wherein an empty space is formed inside each of the first and second sliding rails.

7. The apparatus of claim 1, wherein the sliding guide part comprises a guide body and first and second linear guides having first and second rail accommodating portions, respectively.

8. The apparatus of claim 7, wherein the first and second sliding rails are accommodated in the first and second rail accommodating portions, respectively and are slidingly moved.

9. The apparatus of claim 7, wherein each of the first and second rail accommodating portions has a recessed space having an inner circumferential surface corresponding to an outer circumferential surface of each of the first and second sliding rails.

10. The apparatus of claim 7, wherein the first and second guide bodies comprise first and second recessed regions, and
wherein each of the first and second linear guides is fixedly mounted on the first and second recessed regions.

11. The apparatus of claim 10, wherein each of the first and second recessed regions has a recessed space having an inner circumferential surface corresponding to an outer circumferential surface of each of the first and second linear guides.

12. The apparatus of claim 10, wherein the first and second recessed regions have first and second openings communicating with an outside on one side, and the first and second linear guides have third and fourth openings communicating with the outside on one side.

13. The apparatus of claim 12, wherein each of the third and fourth openings is connected to the first and second openings.

14. The apparatus of claim 12, wherein the third opening has an opening width at least greater than that of the first opening, and the fourth opening has an opening width at least greater than that of the second opening.

15. The apparatus of claim 12, wherein when each of the first and second sliding rails is accommodated in the first and second rail accommodating portions, the first extending part is located in the first and third openings, and the second extending part is located in the second and fourth openings.

16. The apparatus of claim 7, wherein the first and second linear guides are oil-free bearings.

17. The apparatus of claim 7, wherein each of the first and second linear guides comprises protrusions and grooves alternately arranged along an inner circumferential surface thereof.

* * * * *